United States Patent [19]

Gould

[11] 4,206,540
[45] Jun. 10, 1980

[54] SCHOTTKY DEVICE AND METHOD OF MANUFACTURE USING PALLADIUM AND PLATINUM INTERMETALLIC ALLOYS AND TITANIUM BARRIER

[75] Inventor: Herbert J. Gould, Hawthorne, Calif.

[73] Assignee: International Rectifier Corporation, Los Angeles, Calif.

[21] Appl. No.: 911,764

[22] Filed: Jun. 2, 1978

[51] Int. Cl.$^2$ .......................................... H01L 29/48
[52] U.S. Cl. ........................................ 29/590; 427/84; 427/91; 427/125; 357/15; 156/662; 156/638; 156/664
[58] Field of Search ..................... 427/84, 91, 125; 357/15; 29/580, 578, 590; 156/662, 664, 638

[56] References Cited

U.S. PATENT DOCUMENTS

| | | | |
|---|---|---|---|
| 3,515,583 | 6/1970 | Inoue | 427/84 |
| 3,669,730 | 6/1972 | Lepselter | 427/84 |
| 3,906,540 | 9/1975 | Hollins | 357/15 |
| 3,938,243 | 2/1976 | Rosuold | 427/84 |
| 3,968,272 | 7/1976 | Anud | 427/84 |
| 4,110,488 | 8/1978 | Risko | 427/84 |

*Primary Examiner*—Michael F. Esposito
*Attorney, Agent, or Firm*—Ostrolenk, Faber, Gerb & Soffen

[57] ABSTRACT

A schottky diode and process of manufacture therefor is disclosed wherein a schottky junction is formed between a high work function metal, typically molybdenum, and a single crystal intermetallic alloy of either palladium or platinum with silicon. The intermetallic alloy is formed by sintering palladium or platinum with silicon at the surface of an epitaxial silicon layer, and then removing, by etching, all of the silicide which is formed. The intermetallic layer remains after the etching process. When using platinum as the metal to form to silicide, the platinum is sheathed with molybdenum before sintering. A titanium layer is placed between the surface of the high work function metal and the outer conductive layers used to permit soldering of the finished wafer or chip in place to avoid degradation of the junction during solder-down.

10 Claims, 13 Drawing Figures

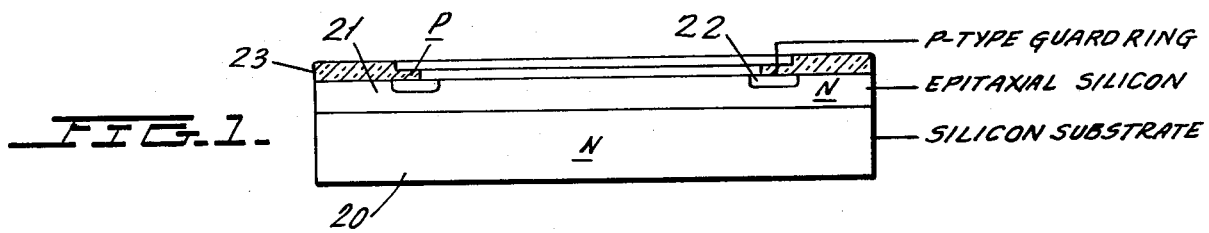
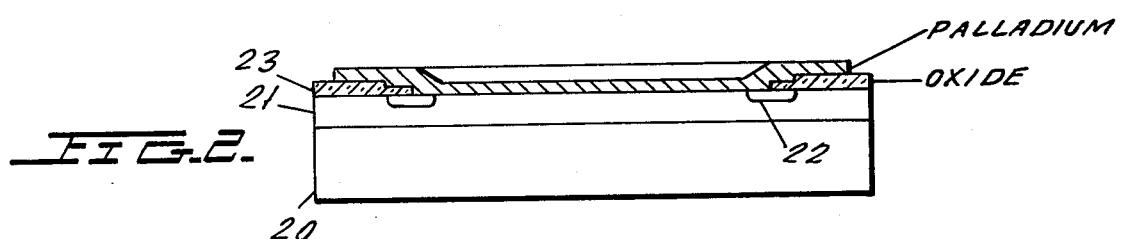
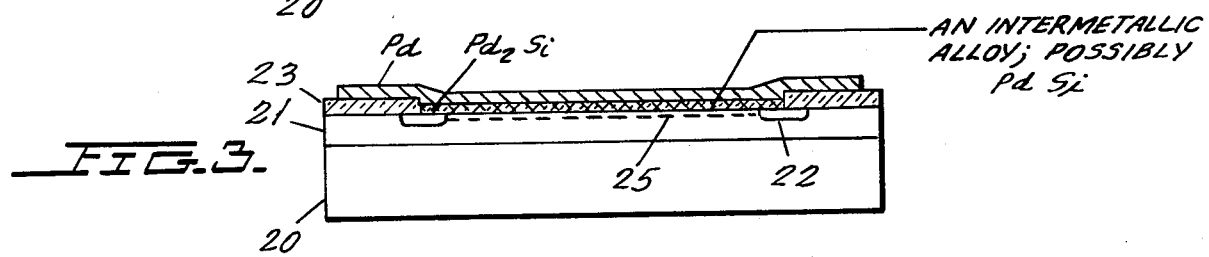
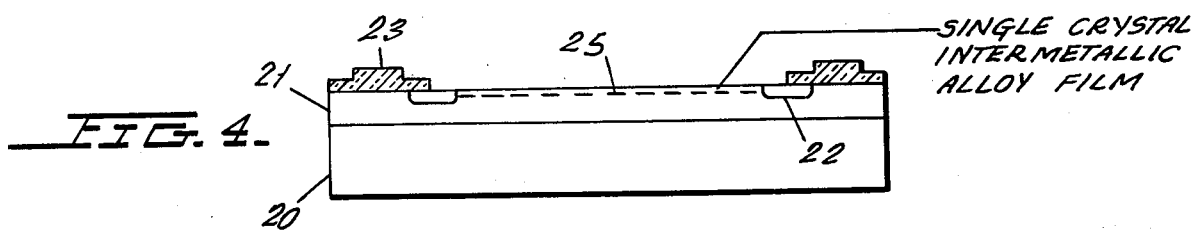
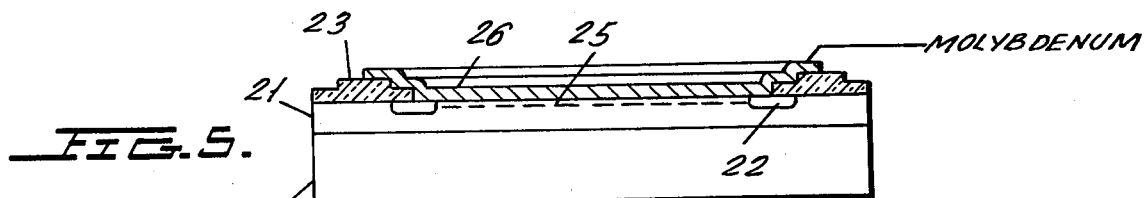
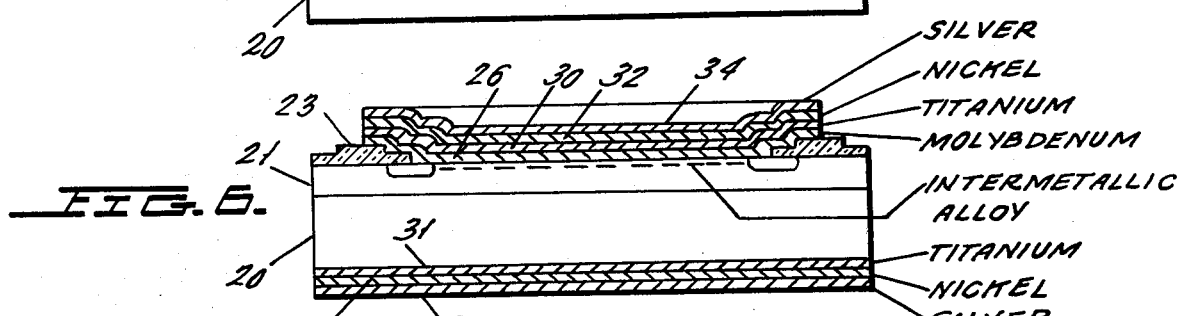
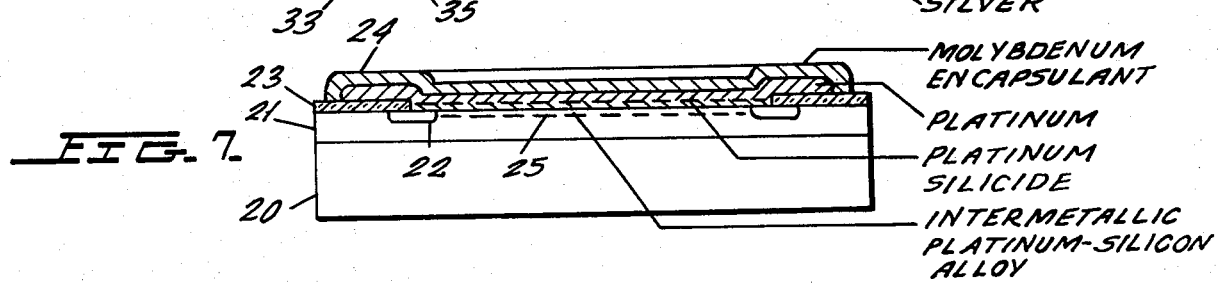

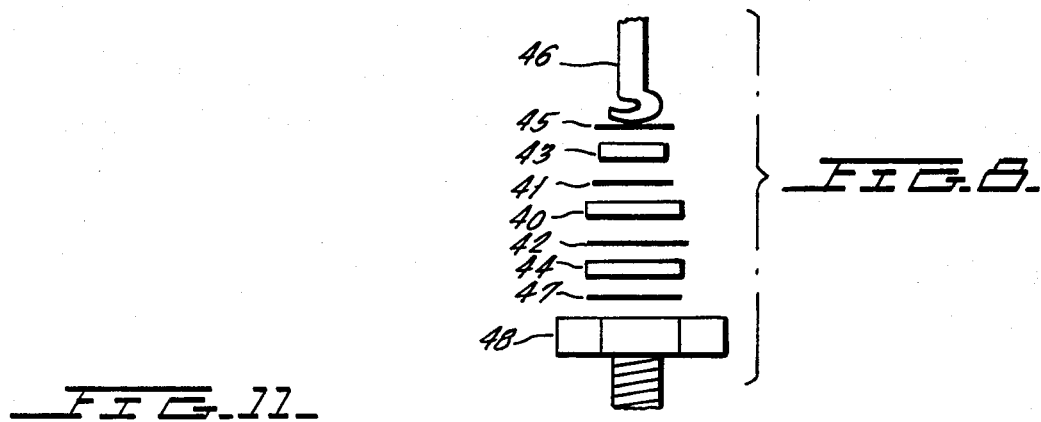
FIG. 8.
FIG. 11.
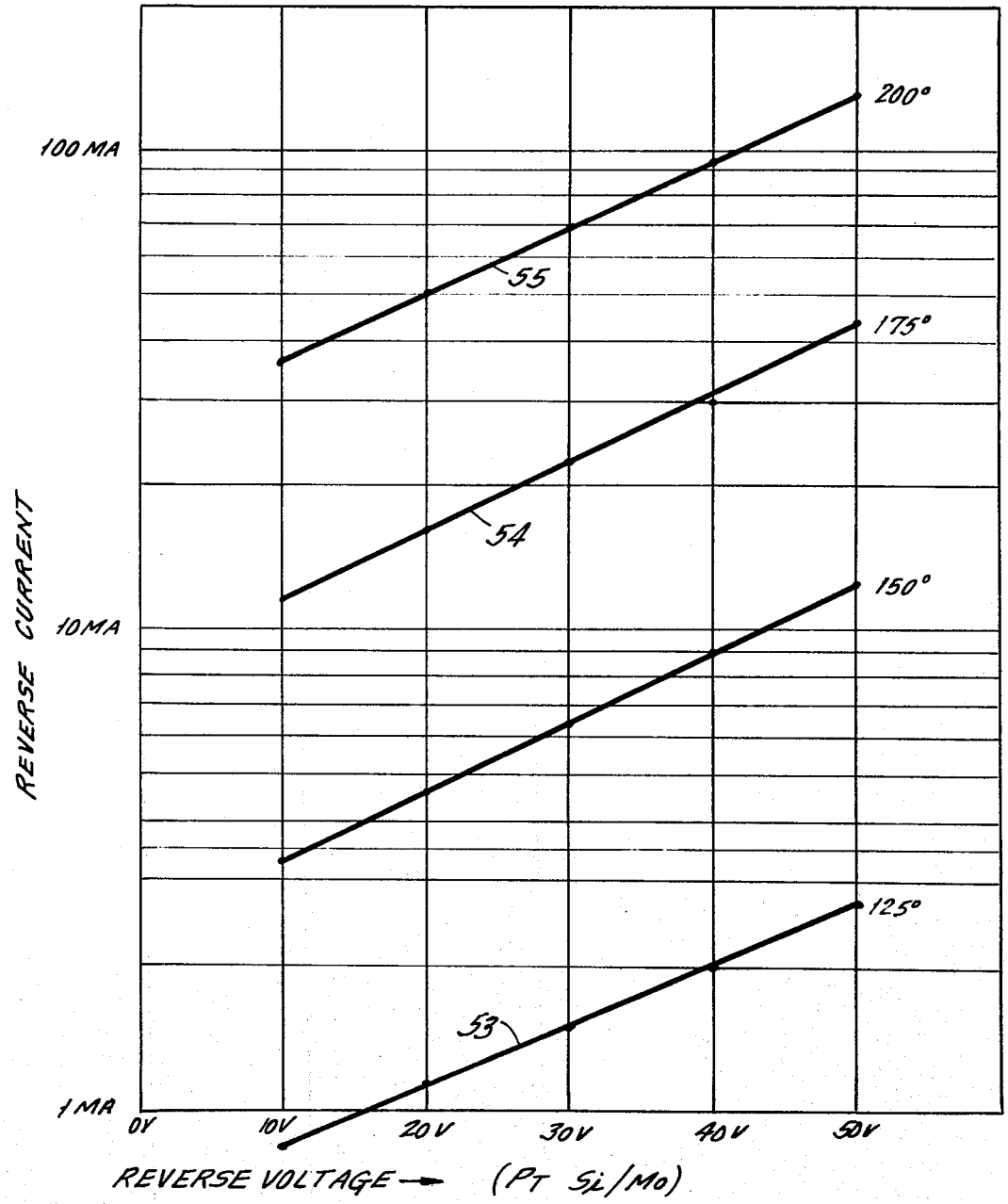

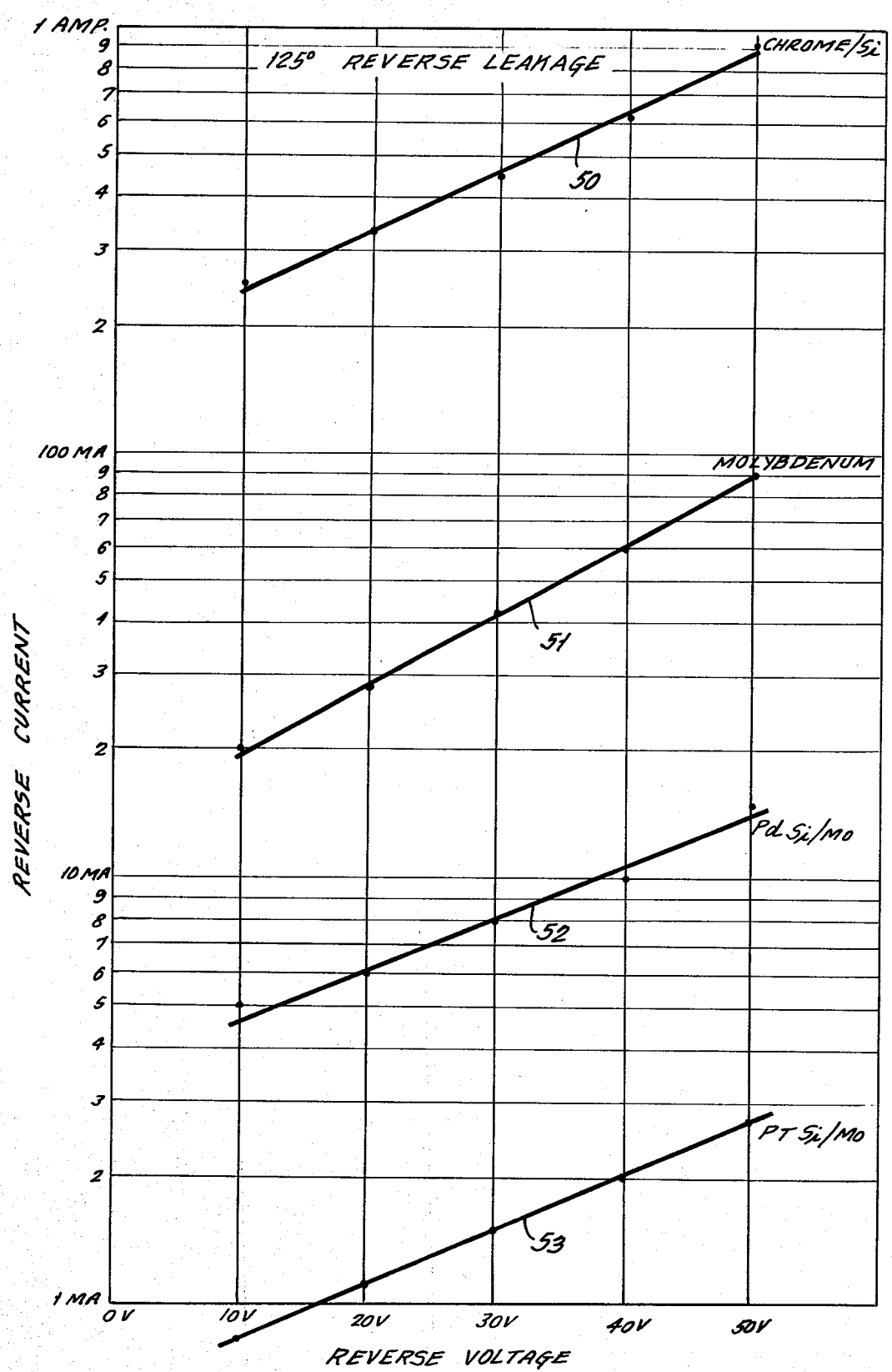

SCHOTTKY DEVICE AND METHOD OF MANUFACTURE USING PALLADIUM AND PLATINUM INTERMETALLIC ALLOYS AND TITANIUM BARRIER

BACKGROUND OF THE INVENTION

This invention relates to schottky diodes, and more specifically relates to a novel structure and process of manufacture therefor.

Schottky rectifiers have limited current and junction temperature ratings due to their high reverse current amplitudes at elevated temperatures. Moreover, it has been found that the schottky junction is frequently degraded when the completed wafer or chip is soldered into place. The present invention provides a novel schottky junction device with relatively low reverse current at relatively high junction temperatures, and one which does not degrade during assembly in its housing.

In the conventional schottky device, a layer of material such as palladium, or platinum, or the like is plated onto a semiconductor surface such as an epitaxial silicon surface. The material, say palladium, is then sintered to form palladium silicide and a high work function metal such as molybdenum, tungsten, or tantalum is deposited on the palladium silicide. The high work function material could also be deposited directly on a silicon surface.

Devices of the above type are well known and are described, for example, in any of U.S. Pat. Nos. 3,290,127; 3,457,912; 3,550,260; 3,585,469; 3,636,417; 3,668,481; 3,694,719, 3,841,904; 3,932,880. The properties of palladium and platinum silicide contacts are disclosed in the following articles:

Metallurgical Properties and Electrical Characteristics of Palladium Silicide—Silicon Contacts by C. J. Kircher, Solid State Electronics, 1971 Vol. 14, pp. 507–513;

Planar Millimeter-Wave Epitaxial Silicon Schottky-Barrier Converter Diodes by W. V. T. Rusch, Solid State Electronics, 1968, Vol. 11, pp. 517–525;

Structure and Electrical Characteristics of Epitaxial Palladium Silicide Contacts, etc. by W. D. Buckley et al., Solid State Electronics, 1972, Vol. 15, pp. 1331–1337;

Formation Kinetics and Structure of $Pd_2Si$ Films on Si, by R. W. Bower et al., Solid State Electronics, 1973, Vol. 16, pp. 1461–1471; and $Pt_2Si$ and PtSi Formation with High-Purity Pt Thin Films by Canali et al., Applied Physics Letters, Vol. 31, No. 1, July 1977, pp. 43–45.

BRIEF DESCRIPTION OF THE PRESENT INVENTION

In accordance with the present invention, a novel process is provided for making a schottky junction having greatly improved reverse current characteristics at high temperature without substantially affecting other parameters of the device. The invention also provides a novel device structure which prevents its degradation during assembly in its case.

In accordance with the invention, a palladium or platinum silicide is diffused into a silicon wafer surface, or other semiconductor surface as by a sintering process. During this process, I have found that a layer of unknown composition but of some intermetallic composition, possibly PdSi for the case of the palladiumsilicon boundary, is formed directly with the silicon surface of the semiconductor substrate. This alloy appears to be a single crystal which is continuous with the single crystal substrate and is unaffected by the etch which will remove the silicide from the silicon substrate.

In the prior art, the silicide was lightly etched before depositing other materials on the silicide. In accordance with the invention, the silicide is completely stripped away as by etching with aqua regia until all $Pd_2Si$ or PtSi is removed from the substrate. The layer of unknown composition remains, and can be sensed by a tungsten probe contact which will reveal a sharp knee in the reverse voltage characteristic formed between the layer and the tungsten probe.

Thereafter, a high work function metal, such as molybdenum, is formed on the surface of the palladium or platinum-silicon intermetallic layer to form a schottky barrier having exceptional high temperature reverse current characteristics.

When palladium silicide is used and stripped away, the resulting device shows an improvement of about one order of magnitude in the reverse current characteristics of the device. When using platinum instead of palladium and, after the platinum is covered with molybdenum during the sintering process, there is a three order of magnitude improvement in reverse leakage current. While the reason for this outstanding behavior is not understood, it is possible that the intermetallic compound which is formed is itself a semiconductor so that putting the molybdenum or other high work function material on that surface makes an excellent schottky junction.

As a further feature of the invention, a titanium layer is formed between the molybdenum, or other high work function metal and the contact metals such as nickel and silver. It has been found that the use of this titanium layer improves the hot reverse leakage of the device and prevents degradation of the schottky junction during soldering of the wafer in its case. It is believed that the titanium getters or prevents the migration of silver, gold and nickel atoms or atoms of other contact materials through the molybdenum and into the junction during the solder-down operation and that it getters mobile atoms, including oxygen atoms present in the molybdenum. The novel titanium barrier between the schottky junction and contact metals can be used for any schottky structure including those which do not use the palladium or platinum silicide contact system.

As a result of the novel process, the same device using the new process for forming the junction has been uprated from 50 amperes to 75 amperes without any other change.

BRIEF DESCRIPTION OF THE DRAWINGS

FIG. 1 is a schematic cross-sectional view of a portion of a semiconductor wafer which can be used in carrying out the present invention, and in which a guard ring has been diffused.

FIG. 2 shows the wafer of FIG. 1 after the formation of a masking oxide layer and after a palladium layer is deposited on the substrate surface.

FIG. 3 shows the wafer of FIG. 2 after the sintering of a palladium layer into the silicon surface.

FIG. 4 shows the wafer of FIG. 3 after the palladium and palladium silicide has been etched away from the substrate, leaving behind a palladiumdiffused silicon surface.

FIG. 5 shows the wafer of FIG. 4 after a molybdenum layer has been deposited on the wafer surface.

FIG. 6 shows the wafer of FIG. 5 after contact metals are applied to the wafer and shows a titanium layer disposed between the schottky barrier and the upper contact metals.

FIG. 7 schematically shows a second embodiment of the invention using platinum in place of palladium, at the stage of manufacture shown in FIG. 3 for the case of palladium.

FIG. 8 shows an exploded view of the assembly of a schottky diode of the invention with the outer housing removed to reveal the interior parts.

FIG. 9 shows the reverse current leakage at 125° C. for four different schottky barriers include the two of the invention.

FIG. 11 shows the reverse current leakage at different temperatures for the platinum-silicon embodiment of this invention.

DETAILED DESCRIPTION OF THE DRAWINGS

Figure 4A:
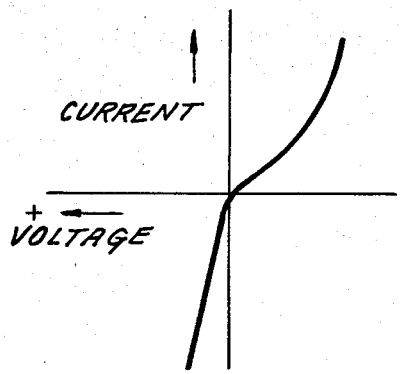
FIGS. 4A and 4B show the reverse voltage characteristics between a tungsten probe and the surface of the wafer of FIG. 4 for the case of incomplete and complete removal, respectively, of the silicide layer.
Figure 4B:
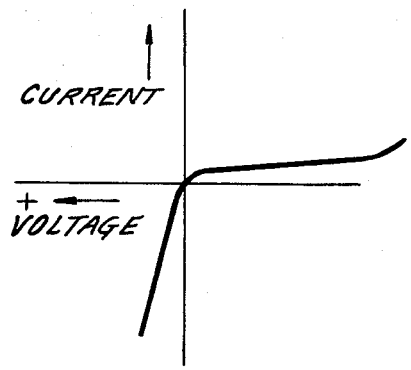

Referring first to FIG. 1, there is shown therein a silicon substrate which may be a small part of a larger wafer on which a plurality of devices are simultaneously formed. The substrate 20 is hereinafter described as a monocrystalline silicon substrate, but it will be understood that other semiconductor materials can be used. Substrate 20 may be Czochralsky grown silicon having a thickness of about 9 mils with N type conductivity using an arsenic dopant. The resistivity of the wafer may be from 0.001 to 0.004 ohm-cm. The wafer section shown in schematic cross-section in FIG. 1 is a rectangular chip section which is a square about 200 mils on edge. Note that the thickness of the wafer is greatly exaggerated for purposes of clarity.

An epitaxial layer 21 is grown atop layer 20 to a thickness of from 5.0 to 6.0 microns. Layer 21 has an N type conductivity and may be phosphorus doped to a resistivity of from 0.9 to 1.1 ohm cm.

FIG. 1 shows a guard ring 22 which is a rectangular P-type ring diffused in the surface 21 to serve as a zener clamp, and to prevent fringing effects. In order to form ring 22, an oxide mask 23 is formed on the surface of layer 21 and a ring-shaped opening is formed in the oxide layer. Boron, or some other P type impurity is then deposited into the open window and is diffused into layer 21 to its desired depth. Guard ring 22 may have a depth of about ½ micron and a width of about 4 mils. The central opening in ring 22 may be about 176 mils.

During diffusion of guard ring 22, an oxide layer grows over the open guard ring window. A window is opened in the oxide layer 23, as shown in FIG. 2, which extends to about the center of the width of guard ring 22, using conventional photolithographic and etching techniques.

After the window is opened in oxide layer 23, a metal, shown in FIGS. 1 to 6 as palladium, is evaporated onto the surface of layer 21 at a substrate temperature of about 250° C. to a thickness of about 1000 Angstroms. Note that platinum metal could have been deposited in place of the palladium. Other metals can also be used if they form an appropriate silicide with the silicon 21.

After deposition of the palladium metal, the palladium and silicon are sintered at a temperature of about 500° C. in a blanket of gas which includes about 15% hydrogen gas and 85% nitrogen gas. Note that, when platinum is used in place of the palladium, a thin layer of molybdenum 24, shown in FIG. 7, is applied over the platinum layer 23 to encapsulate the upper surface of the platinum before sintering.

After the sintering operation, there will be a silicide $Pd_2Si$ present in FIG. 3, and pure palladium on top of the $Pd_2Si$. In the case of the embodiment using platinum, FIG. 7, sintering will produce the silicide PtSi covered by platinum metal.

In the past, the platinum or palladium metals were etched away and contact was made to the silicide layers. It was believed essential that the silicide layer remain intact to make a proper junction. In accordance with the present invention, the silicide layer, whether $Pd_2Si$ or PtSi is intentionally fully removed to expose a lower layer 25 which is diffused into the upper surface of the silicon to form an intermetallic alloy of the palladium (or platinum) and the silicon which is not yet known. However, when the layer 25 is reached, its presence can be sensed by contacting the wafer surface with a tungsten probe. The output of the tungsten probe will change from the rounded knee characteristic of FIG. 4A (indicating that silicide is still present at the surface) to that of FIG. 4B where the silicide is completely removed and the diffused silicon-metal layer 25 is exposed.

Layer 25 is believed to be a single crystal extension of its substrate 21, and, in the case of palladium, it may be PdSi. It is also believed that layer 25 is a semiconductor which makes an excellent schottky junction with a high work function metal such as molybdenum.

In order to expose layer 25, the following etching process was used for the case of the palladium metal. A similar etching process can be used for platinum:

(a) The entire wafer is first immersed into aqua regia (about 3 parts HCl to 1 part $HNO_3$) at room temperature for about 30 seconds. This removes the palladium from the oxide layer.

(b) After rinsing, the wafer is immersed in a 5% HF solution for about 30 seconds. This is a novel step and is taken to remove $SiO_2$ from the palladium (or platinum) surface which is to be etched away.

(c) The wafer is rinsed and then immersed again in aqua regia at room temperature for about 30 seconds to strip palladium metal and $Pd_2Si$ out of the windows down to the surface of layer 25. Note, however, that further etching will be later done. It should be further noted that in the prior art only the palladium metal was removed, and care was taken to leave the $Pd_2Si$ intact.

(d) The wafer is then rinsed and immersed in 5% HF for about 30 seconds to clean off any remaining $SiO_2$.

(e) The wafer is then rinsed and is spun dry.

(f) The above steps are all carried out under a non-critical hood. After step e is completed, the wafer is transferred into an ultra-clean area and is washed with 18 megohm, deionized water.

(g) Thereafter, the wafer is immersed in a solution of one part HCl to one part $HNO_3$ and is boiled in the solution at 60° C. to 70° C. for 30 minutes. This critical step removes all remaining $Pd_2Si$.

(h) The wafer is then rinsed in 18 megohm water, and is then immersed in 5% HF for about 30 seconds.

(i) The wafer is again rinsed in 18 megohm water and is spun dry.

The wafer is now ready to receive a high work function metal which will contact layer 25. Thus, in FIG. 5, a molybdenum layer 26 is evaporated onto the surface of the wafer while the wafer is at 250° C. Layer 26 may have a thickness of about 3000 Angstroms. An excellent schottky junction is then formed between the molybdenum layer 26 and layer 25. Note that other high work function materials such as tungsten or tantalum or others could be used in place of the molybdenum.

It is now necessary to place contact metals on the opposite sides of the wafer of FIG. 6. In accordance with an important feature of the invention, a titanium layer 30 first is deposited on top of the molybdenum layer 26. Titanium layer 30 has a thickness of about 2000 Angstroms. Titanium layer 30 is believed to act as a barrier to prevent migration of atoms of the contact metals to the schottky barrier between layers 25 and 26 due to the high temperatures experienced during soldering of the finished wafer in its housing. This effect has caused degradation of the device during its assembly in the past, but is prevented by the titanium layer. The titanium barrier can be advantageously used in other schottky devices including those making a junction directly between a silicon surface and a high work function material as well as those using a stripped silicide arrangement.

Contact metals are then added to the device as shown in FIG. 6. Thus, a titanium layer 31 having a thickness of about 1000 Angstroms is added to the bottom of the wafer and nickel layers 32 and 33 are applied top and bottom with thicknesses of about 1000 Angstroms. Thereafter, thick silver layers 34 and 35 are applied with thicknesses of about 35,000 Angstroms. Note that any other of the conventional contact metals such as gold could have been used.

The completed device is then cut from its main wafer for assembly into a housing as shown in FIG. 8. The housing may be one with a standard JEDEC outline DO-203AB(DO-5). The completed schottky junction which is a square 200 mils on edge is shown as member 40. Lead-silver-indium solder wafers 41 and 42 are located on opposite sides of junction 40 and molybdenum plates 43 and 44 are placed on the opposite sides of wafers 41 and 42, respectively. Plates 43 and 44 have thicknesses of about 20 mils and diameters of 0.150 inch and 0.325 inch, respectively. A lead-silver-indium solder wafer 45 is disposed between wafer 43 and the C-bend lead 46. A gold-tin solder wafer 47 is disposed between molybdenum wafer 44 and a standard copper base 48. A cap, not shown, encloses the entire assembly. The assembly is soldered together by first heating to melt the solder wafers 41, 42, 45 and 47, and then cooling the assembly. The titanium layer 30 (FIG. 6) prevents migration of silver and nickel atoms to the schottky junction during this solder-down operation.

The resulting device (using the palladium process) will then have an operating junction temperature range of −65° C. to 175° C.; and will have a reverse voltage range of 15 to 45 volts; and a maximum average forward current at 180° C. of 75 amperes for a rectangular waveform or 67.5 amperes for a sinusoidal waveform. The device will have reverse leakage current from 15 milliamperes to 150 milliamperes for a range of junction temperatures of from 100° C. to 150° C. at a reverse voltage of about 45 volts.

Figure 10:
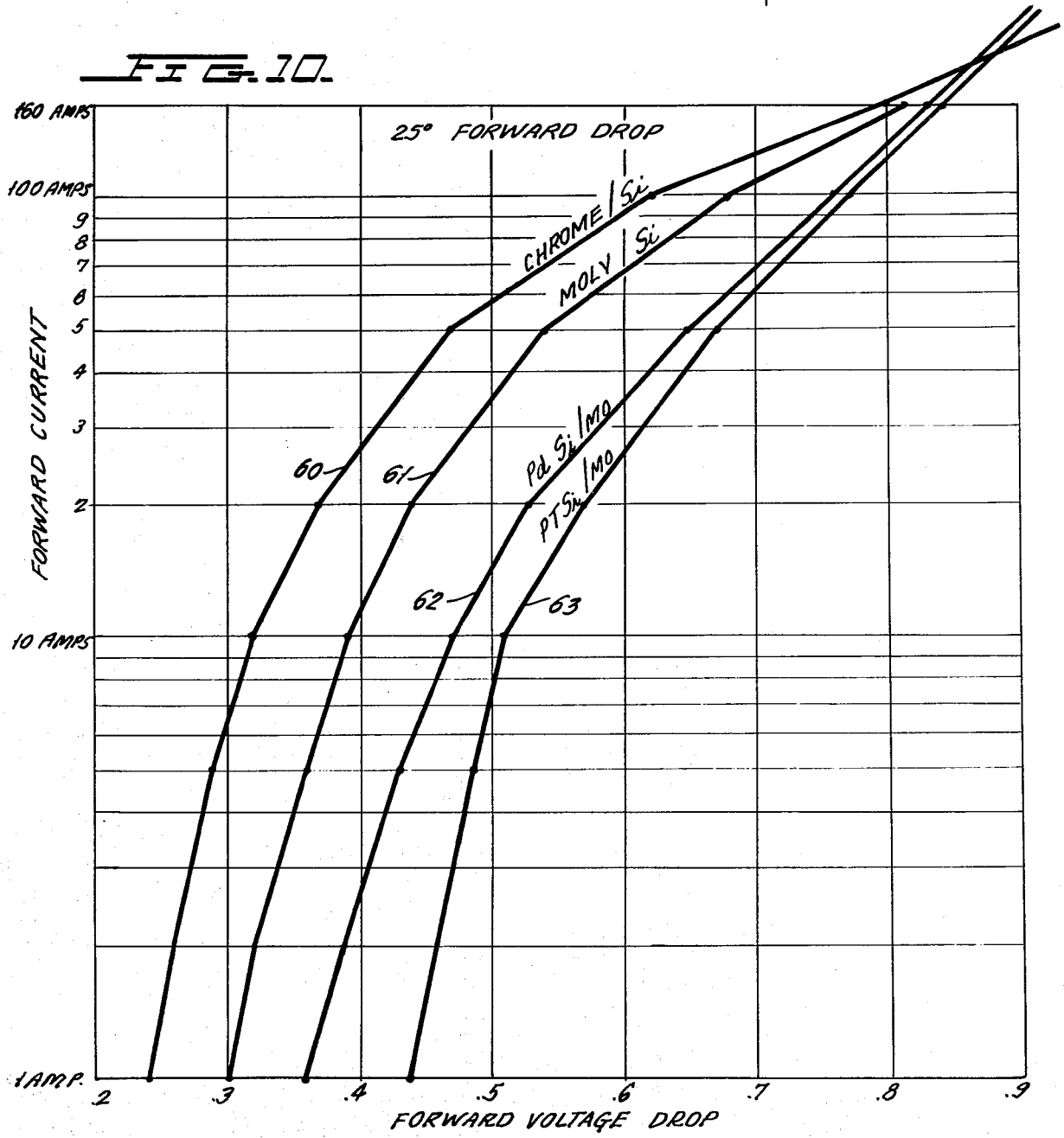
FIG. 10 shows forward voltage drop at 25° C. for the schottky barriers of FIG. 9.

FIGS. 9 to 11 show some of the device characteristics and demonstrate the remarkable improvement in reverse leakage current at high temperature obtained with the invention. Thus, FIG. 9 shows leakage current on a logarithmic vertical axis plotted against reverse voltage on the horizontal axis for four different devices, all at a junction temperature of 125° C. The uppermost curve 50 shows a conventional schottky junction using a chromium contact on a silicon surface. It will be seen that the reverse current approaches one ampere at 50 volts. The second curve 51 shows a conventional molybdenum contact on silicon which has a better reverse current characteristic than the equivalent chromium contact device. However, reverse current for the device is still about 90 milliamps at full reverse voltage.

It will be seen that applicants device, using the palladium process, and using a possibly PdSi region 25 in contact with molybdenum layer 26 (FIG. 6) produces a dramatic improvement in reverse current at full reverse voltage as shown by curve 52. Thus, at 50 volts, the reverse current is only about 15 milliamperes, an improvement of almost one order of magnitude over the prior art molybdenum-silicon junction.

The use of the platinum process (FIG. 7) produces a device with even better reverse current characteristics, as shown in curve 53. Note that, at full reverse voltage, the device reverse current is only about 2.9 milliamperes, which is dramatically less than the prior art devices shown in curves 50 and 51.

The significant improvement in leakage current at high temperature permits the operation of the device of the invention at much higher junction temperatures than prior art devices, and thus allows the substantial uprating of a given device. Thus, as shown in FIG. 11, a junction made with the platinum process shown in FIG. 7, and having the 125° C. characteristic 53 in FIG. 9 can be operated at a junction temperature of 175° C. and still have a better characteristic curve 54 than the conventional molybdenum-silicon junction (curve 51, FIG. 9) at 125° C. Indeed, even at 200° C. (curve 55, FIG. 11), the device characteristics are much better than the chromium-silicon device (curve 50, FIG. 9) at 125° C.

The substantial improvement in reverse current behavior obtained by the invention is not offset by drastic loss of other characteristics. As shown in FIG. 10, there is only a slight increase in forward voltage drop at low current in devices made by the present invention as compared to prior art devices. Thus, curves 60 and 61 of FIG. 10 show the relatively low forward voltage drop, particularly at low forward current for the prior art chromium and molybdenum contacts to silicon. Devices made by the palladium and platinum processes of the invention have the forward voltage characteristics of curves 62 and 63, respectively. All curves of FIG. 10 are plotted at 25° C. Note that at high current the differences are negligible.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. The process of manufacture of a schottky device comprising the steps of depositing a first metal selected from the group consisting of palladium and platinum on the surface of a silicon wafer, sintering said first metal into said surface of said silicon wafer, completely removing all traces of said first metal and any silicides thereof from said surface such that the exposed surface exhibits a sharp knee reverse voltage characteristic when engaged by a tungsten probe, and depositing a high work function metal on said exposed surface.

2. The process of claim 1 which includes the further steps of depositing a titanium layer atop said high work function metal and depositing a contact metal atop said titanium layer and soldering said device into a housing.

3. The process of claim 1 or 2 wherein said first metal and the silicides thereof are removed by etching in aqua regia for an extended period of time.

4. The process of claim 1 or 2 wherein said first metal is palladium, and wherein said surface is made free of any trace of $Pd_2Si$.

5. The process of claim 1 or 2 wherein said first metal is platinum, and wherein said surface is made free of any trace of PtSi.

6. The process of claim 5, wherein said platinum metal is covered with molybdenum during sintering.

7. The process of manufacture of a schottky device comprising the steps of depositing palladium on the surface of a silicon wafer, sintering said palladium into said surface of said silicon wafer, completely removing all traces of said palladium and any silicides thereof from said surface of said silicon wafer, and depositing a high work function metal on said surface after all silicides of palladium have been removed therefrom.

8. The process of claim 7 wherein said palladium and the silicides thereof are removing by etching in aqua regia for an extended period of time.

9. The process of manufacture of a schottky device comprising the steps of depositing platinum on the surface of a silicon wafer, sintering said platinum into said surface of said silicon wafer, removing all traces of said platinum and any silicides thereof from said surface, and depositing a high work function metal on said surface after all of the platinum silicides have been removed therefrom.

10. The process of claim 9 wherein said platinum and the silicides thereof are removed by etching in aqua regia for an extended period time.

* * * * *